(12) United States Patent
Zheng et al.

(10) Patent No.: US 10,978,322 B2
(45) Date of Patent: Apr. 13, 2021

(54) TRANSFER DEVICE, SUBSTRATE PROCESSING APPARATUS, AND TRANSFER METHOD

(71) Applicant: Tokyo Electron Limited, Tokyo (JP)

(72) Inventors: Ao Zheng, Iwate (JP); Koyu Hasegawa, Iwate (JP); Moriyoshi Kinoshita, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 337 days.

(21) Appl. No.: 16/112,941

(22) Filed: Aug. 27, 2018

(65) Prior Publication Data

US 2019/0067055 A1  Feb. 28, 2019

(30) Foreign Application Priority Data

Aug. 30, 2017 (JP) .............................. JP2017-165153
Jun. 22, 2018 (JP) .............................. JP2018-119129

(51) Int. Cl.
*H01L 21/67* (2006.01)
*H01L 21/677* (2006.01)
*H01L 21/673* (2006.01)

(52) U.S. Cl.
CPC .. *H01L 21/67248* (2013.01); *H01L 21/67265* (2013.01); *H01L 21/67742* (2013.01); *H01L 21/67745* (2013.01); *H01L 21/67748* (2013.01); *H01L 21/67754* (2013.01); *H01L 21/67772* (2013.01); *H01L 21/67109* (2013.01);

(Continued)

(58) Field of Classification Search
CPC ................................................. H01L 21/67248
See application file for complete search history.

(56) References Cited

U.S. PATENT DOCUMENTS

2003/0012255 A1* 1/2003 Koshimizu .............. G01K 7/00
374/117
2008/0240891 A1* 10/2008 Obikane ........... H01L 21/67778
414/222.13

(Continued)

FOREIGN PATENT DOCUMENTS

JP 04-286143 A 10/1992
JP 05144925 A * 6/1993
JP 2002-198297 A 7/2002

(Continued)

OTHER PUBLICATIONS

JP05144925A—machine translation (Year: 1993).*

*Primary Examiner* — Nathaniel Herzfeld
(74) *Attorney, Agent, or Firm* — Abelman, Frayne & Schwab

(57) ABSTRACT

A transfer device of an embodiment includes a transporter including a temperature sensor disposed thereon and configured to move between a measurement position at which a temperature of a transfer target object is measured and a standby position separated from the measurement position, and a controller configured to control an operation of the transporter, and the controller moves the transporter between the measurement position and the standby position, and transfers the transfer target object by the transporter when the temperature measured by the temperature sensor at the measurement position continues to be equal to or less than a threshold for a first time.

14 Claims, 10 Drawing Sheets

(52) U.S. Cl.
  CPC .. *H01L 21/67303* (2013.01); *H01L 21/67757* (2013.01); *H01L 21/67781* (2013.01)

(56) References Cited

U.S. PATENT DOCUMENTS

2009/0092940 A1* 4/2009 Hishiya ............. H01L 21/67109
                                                    432/36
2015/0099235 A1* 4/2015 Watanabe ......... H01L 21/67109
                                                    432/45

FOREIGN PATENT DOCUMENTS

| JP | 2004281618 A | * 10/2004 |
| JP | 2007-251088 A | 9/2007 |
| JP | 2016-178216 A | 10/2016 |

\* cited by examiner

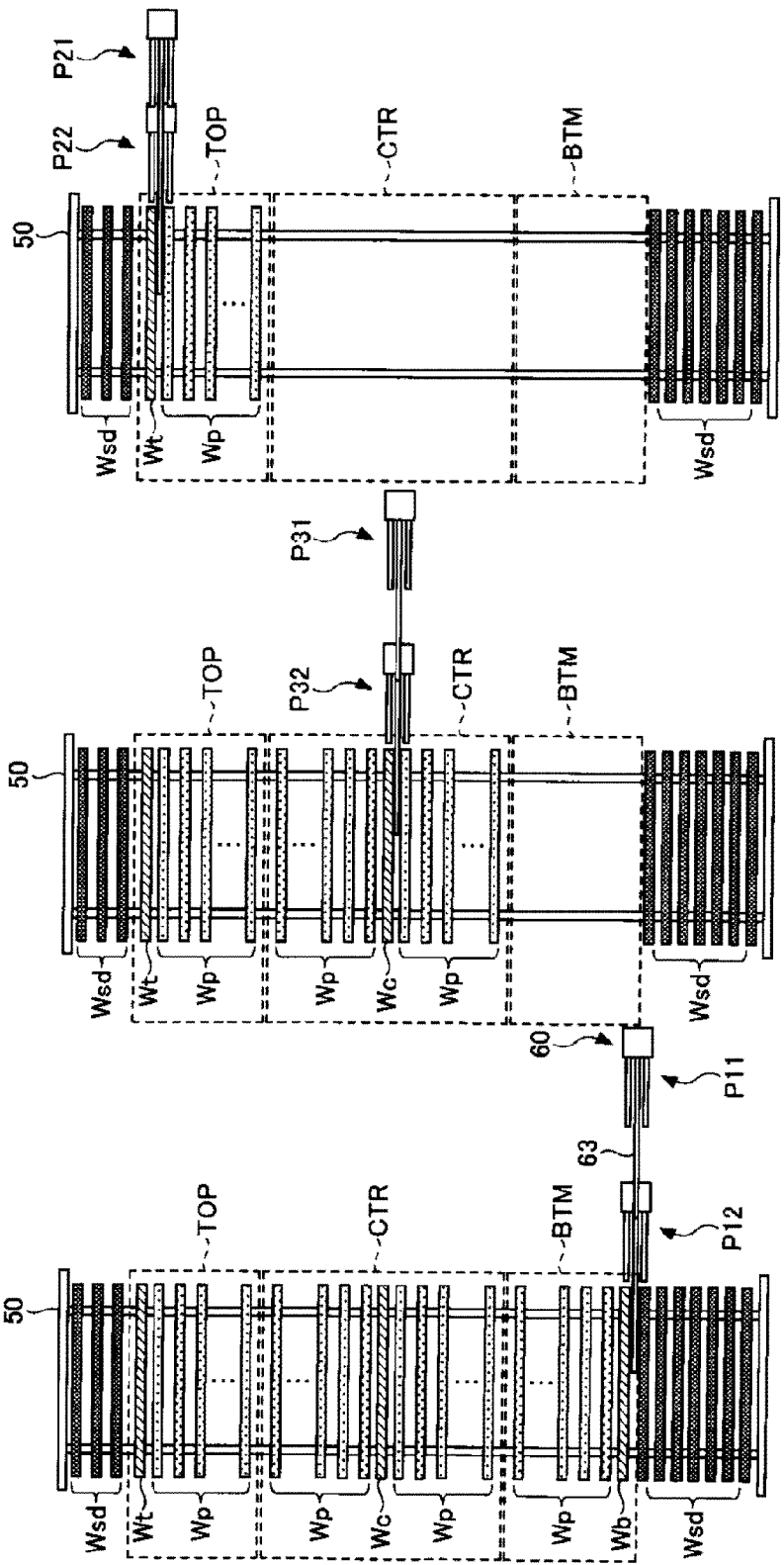

US 10,978,322 B2

TRANSFER DEVICE, SUBSTRATE PROCESSING APPARATUS, AND TRANSFER METHOD

CROSS-REFERENCE TO RELATED APPLICATIONS

This application is based on and claims priority from Japanese Patent Application Nos. 2017-165153 and 2018-119129, filed on Aug. 30, 2017 and Jun. 22, 2018, respectively, with the Japan Patent Office, the disclosure of which is incorporated herein in its entirety by reference.

TECHNICAL FIELD

The present disclosure relates to a transfer device, a substrate processing apparatus, and a transfer method.

BACKGROUND

In the related art, there has been known a vertical type heat treatment apparatus that includes a vertically elongated heat treatment furnace and accommodates a plurality of wafers in the heat treatment furnace in a state of being placed on a wafer boat to perform heat treatment, thereby heating the wafers (see, e.g., Japanese Patent Laid-Open Publication No. 2016-178216).

In the vertical type heat treatment apparatus, after heat treatment is performed on the wafers, the wafer boat is carried out from the heat treatment furnace, and after a predetermined cooling time has elapsed, a transfer device transfers the wafers from the wafer boat into a front-opening unified pod (FOUP) to collect the wafers. The cooling time is the sum of a time required for the wafers to be cooled to a predetermined temperature (e.g., 80° C.) and a predetermined standby time (margin time). The time required for the wafers to be cooled to the predetermined temperature is preset based on the results of, for example, a preliminary experiment.

SUMMARY

A transfer device according to an aspect of the present disclosure includes a transporter including: a temperature sensor disposed thereon and configured to move between a measurement position at which a temperature of a transfer target object is measured and a standby position separated from the measurement position, and a controller configured to control an operation of the transporter, and the controller moves the transporter between the measurement position and the standby position, and transfers the transfer target object by the transporter when the temperature measured by the temperature sensor at the measurement position continues to be equal to or less than a threshold for a first time.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 9A to 9C are schematic views illustrating the example of the operation of the wafer transfer device according to the embodiment of the present disclosure.

DESCRIPTION OF EMBODIMENT

Figure 1:
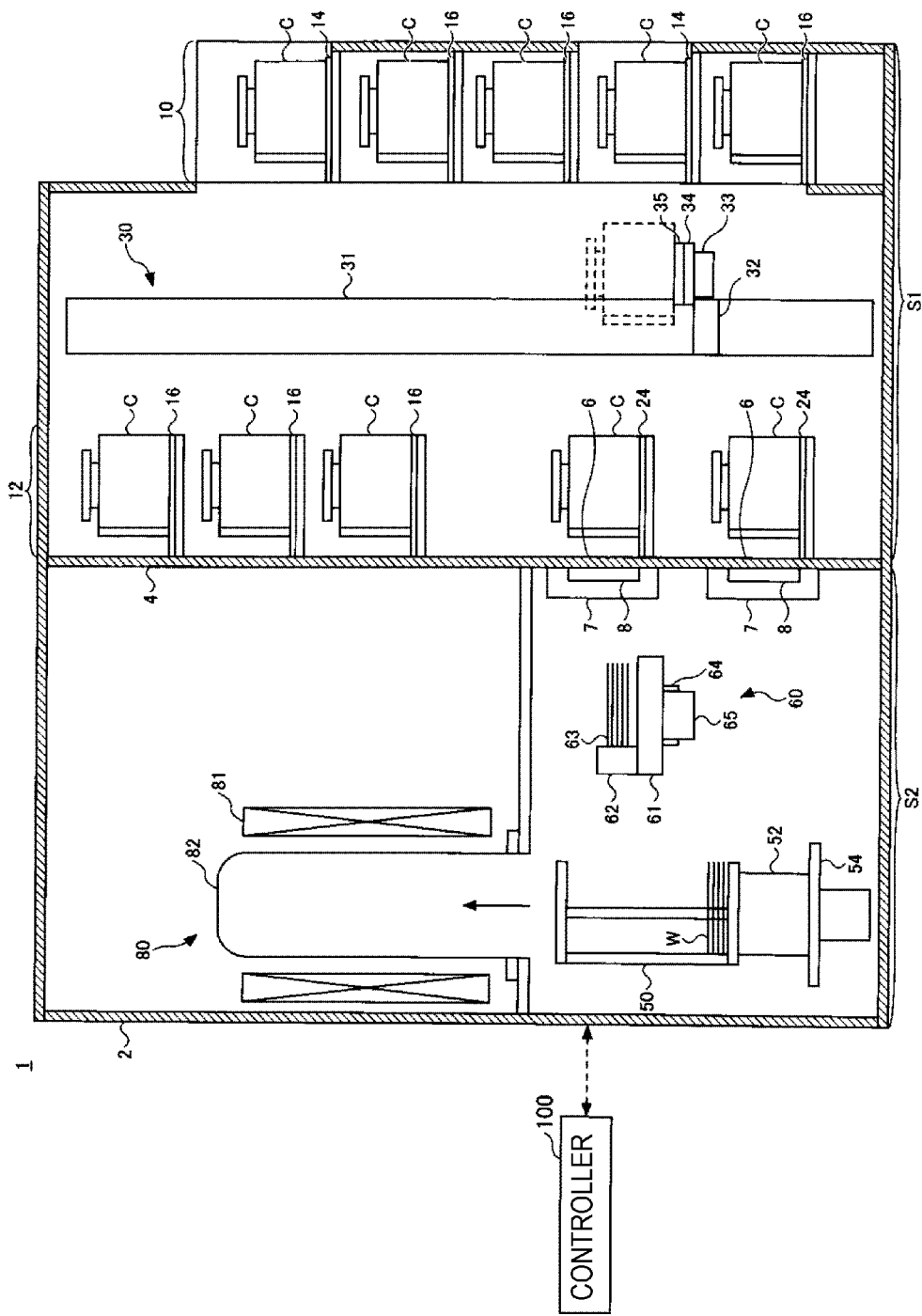
FIG. 1 is a schematic view illustrating a configuration of a substrate processing apparatus including a transfer device according to an embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the above-described apparatus, since the predetermined standby time is included in a time required for wafer transfer, a time until wafer collection is increased by the standby time.

Therefore, in view of the above-described problem, an object is to shorten a collection time and improve productivity.

To achieve the object, a transfer device according to an aspect of the present disclosure includes a transporter including a temperature sensor disposed thereon and configured to move between a measurement position at which a temperature of a transfer target object is measured and a standby position separated from the measurement position, and a controller configured to control an operation of the transporter, and the controller moves the transporter between the measurement position and the standby position, and transfers the transfer target object by the transporter when the temperature measured by the temperature sensor at the measurement position continues to be equal to or less than a threshold for a first time.

In the above-described transfer device, the controller moves the transporter to the standby position when the temperature exceeds the threshold within the first time at the measurement position, and moves the transporter to the measurement position after an elapse of a second time at the standby position.

In the above-described transfer device, the first time and the second time are determined based on characteristics of the temperature sensor.

In the above-described transfer device, the transporter includes a position detection sensor disposed thereon to detect a position of the transfer target object, and the controller determines whether or not the position of the transfer target object detected by the position detection sensor is normal, and moves the transporter to the measurement position when the position of the transfer target object is normal.

In the above-described transfer device, the transfer target object is a substrate held on a substrate holder configured to hold a plurality of substrates substantially horizontally at a predetermined interval in a vertical direction.

A substrate processing apparatus of an aspect of the present disclosure includes: a heat treatment furnace; a substrate holder configured to accommodate a plurality of substrates in the heat treatment furnace in a state where the substrates are held; a transporter comprising a temperature sensor disposed thereon and configured to move between a measurement position at which a temperature of the plurality of substrates is measured and a standby position separated from the measurement position; and a controller configured to control an operation of the transporter, wherein the controller moves the transporter between the measurement position and the standby position, and carries out the plurality of substrates from the substrate holder by the transporter when the temperature measured by the temperature sensor at the measurement position continues to be equal to or less than a threshold for a first time.

In the above-described substrate processing apparatus, the controller determines whether or not a capability of cooling the plurality of substrates is normal based on a time after the substrate holder is carried out from the heat treatment furnace and before the plurality of substrates starts to be carried out.

A transfer method of an aspect of the present disclosure includes: moving a transporter comprising a temperature sensor disposed thereon between a measurement position at which a temperature of a transfer target object is measured and a standby position separated from the measurement position; and transferring the transfer target object when the temperature measured by the temperature sensor at the measurement position continues to be equal to or less than a threshold for a first time.

According to a transfer device of the disclosure, it is possible to shorten a collection time and improve productivity.

Hereinafter, modes for implementing the present disclosure will be described with reference to the accompanying drawings. In addition, in this specification and the drawings, substantially the same components will be denoted by the same reference numerals, and a redundant description thereof will be omitted.

A wafer transfer device according to an embodiment of the present disclosure may be applied to various substrate processing apparatuses, but, for easy understanding, a case where a vertical type heat treatment apparatus is used as an exemplary substrate processing apparatus will be described by way of example.

Figure 2:
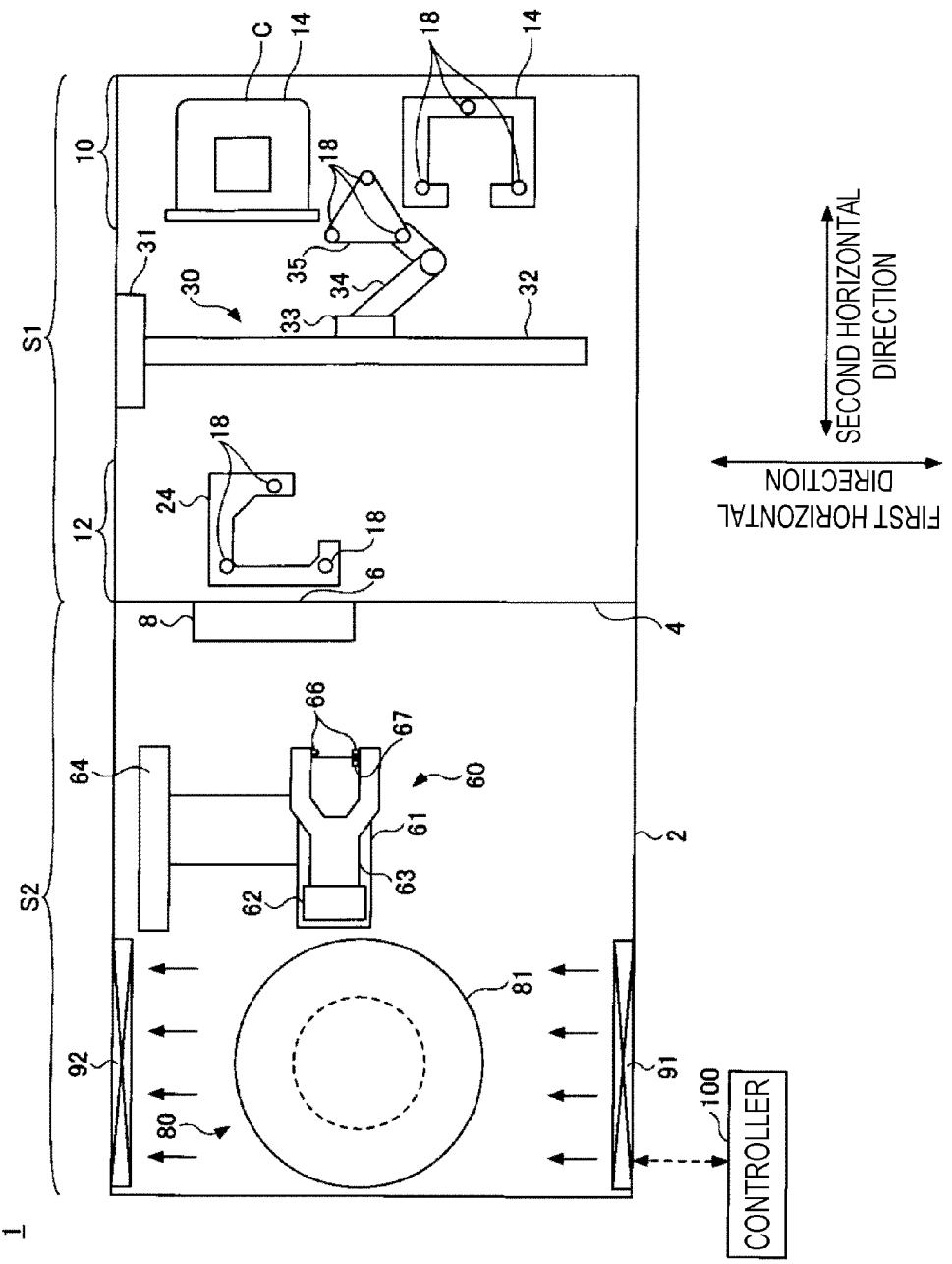
FIG. 2 is a schematic plan view of the substrate processing apparatus including the transfer device according to the embodiment of the present disclosure.

An exemplary configuration of a substrate processing apparatus including a wafer transfer device according to an embodiment of the present disclosure will be described with reference to FIGS. 1 and 2. FIG. 1 is a schematic view illustrating a configuration of a substrate processing apparatus including a transfer device according to an embodiment of the present disclosure. FIG. 2 is a schematic plan view of the substrate processing apparatus including the transfer device according to the embodiment of the present disclosure. In addition, for the convenience of description, FIG. 2 illustrates a state where a carrier C is not placed on one of load ports 14 and on an FIMS port 24 of FIG. 1.

The substrate processing apparatus 1 is accommodated in a case 2 constituting an exterior body of the apparatus. In the case 2, a carrier transfer region S1 and a wafer transfer region S2 are formed. The carrier transfer region S1 and the wafer transfer region S2 are partitioned by a partition wall 4. The partition wall 4 is provided with a transfer port 6 for making communication between the carrier transfer region S1 and the wafer transfer region S2 and transferring a wafer W. The transfer port 6 is opened and closed by a door mechanism 8 based on the front-opening interface mechanical standard (FIMS). A drive mechanism of a lid opening and closing device 7 is connected to the door mechanism 8, and the door mechanism 8 is configured to be movable in the longitudinal direction and in the vertical direction by the drive mechanism, so that the transfer port 6 is opened and closed.

Hereinafter, the arrangement direction of the carrier transfer region S1 and the wafer transfer region S2 will be referred to as a longitudinal direction (corresponding to a second horizontal direction to be described later), and the horizontal direction perpendicular to the longitudinal direction will be referred to as a transverse direction (corresponding to a first horizontal direction to be described later).

The carrier transfer region S1 is a region under an atmospheric atmosphere. The carrier transfer region S1 is a region in which the carrier C in which a semiconductor wafer (hereinafter referred to as "wafer W") as a transfer target object is accommodated is transferred between elements to be described later inside the substrate processing apparatus 1, is carried into the substrate processing apparatus 1 from the outside, or is carried out from the substrate processing apparatus 1 to the outside. The carrier C may be, for example, a front-opening unified pod (FOUP). By keeping the degree of cleanliness in the FOUP at a predetermined level, adhesion of foreign substances to the surface of the wafer W or natural formation of an oxide film may be prevented. The carrier transfer region S1 is composed of a first transfer region 10 and a second transfer region 12 located behind the first transfer region 10 (on the wafer transfer region S2 side).

In the first transfer region 10, for example, load ports 14 are provided in two upper and lower stages (see FIG. 1) and at two left and right sides in each stage (see FIG. 2). The load port 14 is a carry-in placing table that receives the carrier C when the carrier C is carried into the substrate processing apparatus 1. The load port 14 is provided at a position at which the wall of the housing 2 is opened, and enables access to the substrate processing apparatus 1 from the outside. Specifically, by a transfer device (not illustrated) provided outside the substrate processing apparatus 1, the carrier C may be carried into and placed on the load port 14, and may be carried out from the load port 14 to the outside. In addition, since the load ports 14 exist, for example, in two upper and lower stages, the carry-in/ out of the carrier C is possible in two directions. A stocker 16 may be provided in the lower stage of each load port 14 in order to enable the storage of the carrier C. On the surface of the load port 14 on which the carrier C is placed, positioning pins 18 for positioning the carrier C are provided, for example, at three positions. In addition, the load port 14 may be configured to be movable in the longitudinal direction in a state where the carrier C is placed on the load port 14.

In the lower section of the second transfer region 12, two FIMS ports 24 are arranged side by side in the vertical direction (see FIG. 1). The FIMS port 24 is a holding table that holds the carrier C when the wafer W in the carrier C is carried into and carried out from a heat treatment furnace 80 to be described later inside the wafer transfer region S2. The FIMS port 24 is configured to be movable in the longitudinal direction. Similarly to the load port 14, the positioning pins 18 for positioning the carrier C are provided at three positions on the surface of the FIMS port 24 on which the carrier C is placed.

The stocker 16 that stores the carrier C is provided in the upper section of the second transfer region 12. The stocker 16 may be configured with, for example, three stages of shelves, and two or more carriers C may be placed on each shelf in the transverse direction. In addition, the stocker 16 may be disposed in a region in which no carrier placing table is disposed in the lower section of the second transfer region 12.

A carrier transfer mechanism 30 is provided between the first transfer region 10 and the second transfer region 12 to transfer the carrier C between the load port 14, the stocker 16, and the FIMS port 24.

The carrier transfer mechanism 30 includes a first guide 31, a second guide 32, a movement unit 33, an arm unit 34, and a hand unit 35. The first guide 31 is configured to extend in the vertical direction. The second guide 32 is connected to the first guide 31, and is configured to extend in the transverse direction (first horizontal direction). The movement unit 33 is configured to move in the transverse direction while being guided by the second guide 32. The arm unit 34 includes one joint and two arm portions, and is provided on the movement unit 33. The hand unit 35 is provided at the tip end of the arm unit 34. The pins 18 for positioning the carrier C are provided at three positions on the hand unit 35.

The wafer transfer region S2 is a region in which the wafer W is taken out from the carrier C and is subjected to various processings. The wafer transfer region S2 is set to an inert gas atmosphere, for example, nitrogen ($N_2$) gas atmosphere in order to prevent an oxide film from being formed on the wafer W. In the wafer transfer region S2, the vertical type heat treatment furnace 80, the lower end of which is opened as a furnace opening, is provided.

The heat treatment furnace 80 includes a cylindrical processing container 82, which is capable of accommodating the wafer W therein and is formed of quartz for performing heat treatment on the wafer W. A cylindrical heater 81 is disposed around the processing container 82, and heat treatment is performed on the accommodated wafer W by heating of the heater 81. A shutter (not illustrated) is provided below the processing container 82. The shutter is a door for covering the lower end of the heat treatment furnace 80 after a wafer boat 50 is carried out from the heat treatment furnace 80 and before a next wafer boat 50 is carried into the heat treatment furnace 80. Below the heat treatment furnace 80, the wafer boat 50 as a substrate holder is placed above a lid 54 with a heat insulating cylinder 52 interposed therebetween. In other words, the lid 54 is provided integrally with the wafer boat 50 below the wafer boat 50.

The wafer boat 50 is formed of quartz, for example, and is configured to hold the wafers W having a large diameter (e.g., a diameter of 300 mm or 450 mm) substantially horizontally at a predetermined interval in the vertical direction. The number of wafers W accommodated in the wafer boat 50 is not particularly limited, but may be, for example, within a range from 50 to 200. The lid 54 is supported by an elevating mechanism (not illustrated), and the wafer boat 50 is carried into or carried out from the heat treatment furnace 80 by the elevating mechanism. A wafer transfer device 60 is provided between the wafer boat 50 and the transfer port 6.

The wafer transfer device 60 transfers the wafer W between the carrier C held on the FIMS port 24 and the wafer boat 50. The wafer transfer device 60 includes a guide mechanism 61, a moving body 62, a fork 63, an elevating mechanism 64, and a rotation mechanism 65. The guide mechanism 61 has a rectangular parallelepiped shape. The guide mechanism 61 is attached to the elevating mechanism 64 which extends in the vertical direction, and is configured to be movable in the vertical direction by the elevating mechanism 64 and rotatable by the rotation mechanism 65. The moving body 62 is provided on the guide mechanism 61 so as to be movable forward and rearward along the longitudinal direction. The fork 63 is a transporter attached via the moving body 62, and is provided in a plural number (e.g., five). Since a plurality of wafers W may be transported at the same time through the provision of a plurality of forks 63, the time required for transferring the wafers W may be shortened. However, one fork 63 may be used.

A position detection sensor 66 is provided on the inner side surface of the tip end of the fork 63. The position detection sensor 66 is, for example, a pair of opposite photodetectors. When the wafer W is held on the wafer boat 50, the position detection sensor 66 detects whether or not the position of the wafer W is normal, such as for example, whether or not the wafer W protrudes from the wafer boat 50 or whether or not the position thereof deviates. The position detection sensor 66 is composed of a set of a light emitting element and a light receiving element, emits light from the light emitting element, and receives light by the light receiving element. When no object (detection target object) is present between the light emitting element and the light receiving element, light from the light emitting element is received by the light receiving element. When the object is present, light from the light emitting element is blocked and the light receiving element may not receive light. Thus, since light is blocked when the fork 63 is brought close to the wafer W to the height at which the wafer W is placed on the wafer boat 50 and light is not blocked when the wafer W does not protrude, whether or not the wafer W protrudes may be detected.

In addition, a temperature sensor 67 is provided on the inner side of the tip end of the fork 63. The temperature sensor 67 measures the temperature in the vicinity of the fork 63. For example, the temperature of the wafer W may be measured in a noncontact manner by inserting the fork 63 between two adjacent wafers W among the plurality of wafers W held on the wafer boat 50. In addition, for example, the temperature is measured at a plurality of points in the wafer transfer region S2 by moving the position of the fork 63. In addition, for example, since the fork 63 holds the wafer W, the temperature of the held wafer W is measured in a noncontact manner Various thermocouples may be used as the temperature sensor 67, but an ultrafine wire thermocouple (e.g., having a tip end wire diameter of 25 μm) may be used from the viewpoint of fast responsiveness and that it is capable of measuring the temperature with high accuracy. In addition, a resistance temperature detector may also be used as the temperature sensor 67. In addition, the temperature sensor 67 may be provided at a position other than the inner side of the tip end of the fork 63.

A fan filter unit (FFU) 91 is provided on one sidewall portion of the wafer transfer region S2, and a gas suction unit 92 is provided on the other sidewall portion opposite the sidewall portion provided with the FFU 91. The FFU 91 includes a filter, such as for example a high efficiency particulate air (HEPA) filter or an ultra-low penetration air (ULPA) filter, and a gas blowing fan. The FFU 91 supplies a gas (e.g., an inert gas, such as for example, $N_2$ gas) cleaned via a filter to the wafer transfer region S2. The gas suction unit 92 suctions the cleaned gas supplied from the FFU 91 to the wafer transfer region S2. The gas suction unit 92 is connected to, for example, a duct (not illustrated). While the substrate processing apparatus 1 is in operation, by the FFU 91 and the gas suction unit 92, the supply and suction of the cleaned gas are continuously performed and a horizontal gas stream (see arrows in FIG. 2) is formed in the wafer transfer region S2. By this gas stream, the wafer transfer region S2 is kept clean and an increase in the temperature of the wafer transfer region S2 is suppressed. In addition, by the gas stream, the wafer W after heat treatment held on the wafer boat 50 carried out from the heat treatment furnace 80 is cooled. In addition, a cooling mechanism, such as for example, a water cooling unit may be provided to cool the wafer W after heat treatment, together with the FFU 91 and the gas suction unit 92 or instead of the FFU 91 and the gas suction unit 92.

As illustrated in FIGS. 1 and 2, a controller 100 is provided to control the entire substrate processing apparatus 1. The controller 100 controls operations of various devices in the substrate processing apparatus 1 so that heat treatment is performed according to a recipe under various processing conditions indicated in the recipe. In addition, the controller 100 grasps, for example, the position of the wafer W by receiving signals from various sensors provided in the substrate processing apparatus 1 and performs sequence control to proceed with a process. In addition, the controller 100 may grasp the state of a substrate processing by receiving, for example, physical measurement values detected by various detectors provided in the substrate processing apparatus 1 and perform, for example, feedback control required to appropriately perform the substrate processing.

The controller 100 includes a calculation unit, such as for example, a central processing unit (CPU), a read only memory (ROM), and a random access memory (RAM), and a storage unit. The controller 100 may be configured as a microcomputer in which a program for the implementation of a processing of the recipe is installed from a storage medium storing the program therein and which executes a processing of the recipe. In addition, the controller 100 may be configured as an electronic circuit such as an application specific integrated circuit (ASIC).

Figure 3:
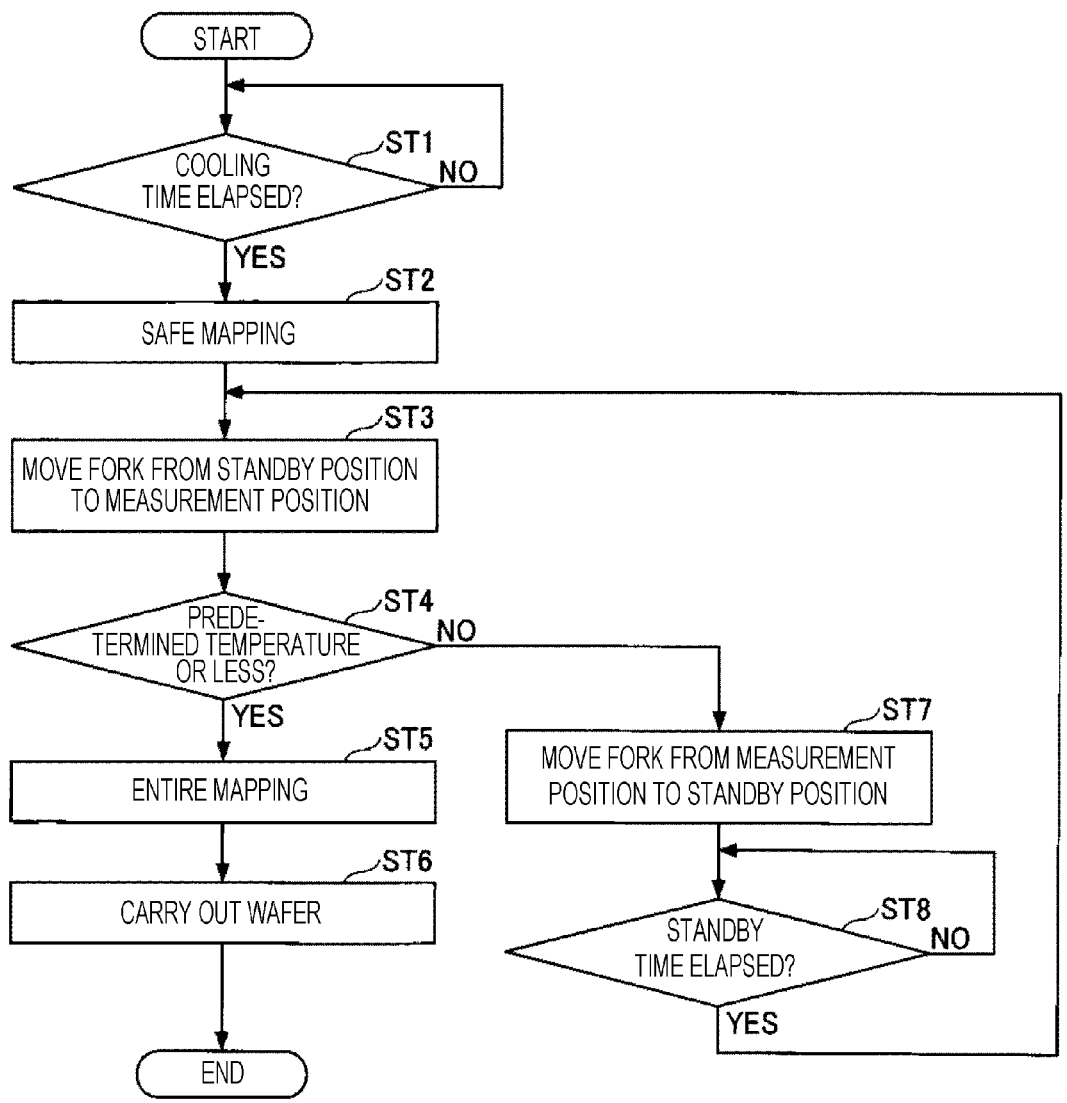
FIG. 3 is a flowchart illustrating an example of an operation of a wafer transfer device according to an embodiment of the present disclosure.
Figure 4:
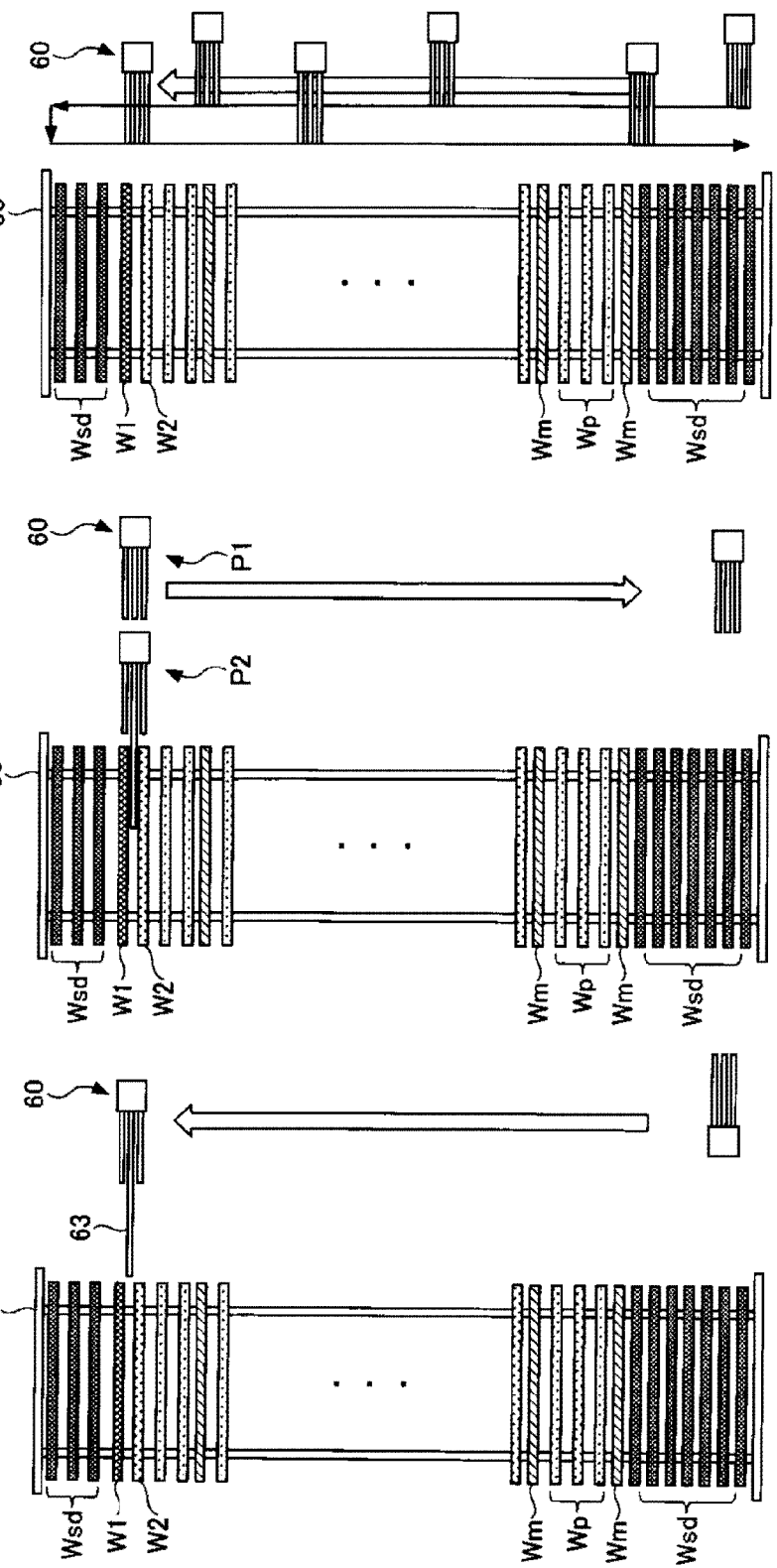
FIGS. 4A to 4C are schematic views illustrating the example of the operation of the wafer transfer device according to the embodiment of the present disclosure.

Next, an example of an operation (a transfer method) of collecting the wafer W subjected to heat treatment to the FOUP by the wafer transfer device 60 according to the embodiment of the present disclosure will be described with reference to FIGS. 3, 4A, 4B, and 4C. FIG. 3 is a flowchart illustrating an example of an operation of the wafer transfer device 60 according to the embodiment of the present disclosure. FIGS. 4A to 4C are schematic views illustrating the example of the operation of the wafer transfer device 60 according to the embodiment of the present disclosure. In addition, in FIGS. 4A to 4C, "Wsd" is a dummy wafer, "Wm" is a monitor wafer, and "Wp" is a product wafer. In the following description, it is assumed that the monitor wafer Wm and the product wafer Wp are the carry-out target wafers W.

When the wafer boat 50 holding the wafer W subjected to heat treatment is carried out from the heat treatment furnace 80, the wafer W is cooled by the gas stream formed by the FFU 91 and the gas suction unit 92. Then, the controller 100 determines whether or not a predetermined time (hereinafter referred to as "cooling time") has elapsed after the start of the cooling of the wafer W (step ST1). The cooling time may be determined according to, for example, the conditions of heat treatment, and may be, for example, 1 to 60 minutes. Specifically, for example, the cooling time is lengthened as the temperature of heat treatment is higher, and the cooling time is shortened as the temperature of heat treatment is lower. In the embodiment of the present disclosure, the cooling time is 10 minutes.

When the cooling time has elapsed in step ST1, the controller 100 controls an operation of the wafer transfer device 60 so as to perform safe mapping on a wafer W1 as a temperature measurement target among the plurality of wafers W held on the wafer boat 50 (step ST2). Specifically, as illustrated in FIG. 4A, the controller 100 controls the operation of the wafer transfer device 60 so as to move the fork 63 to a position at the same height as the wafer W1 as the temperature measurement target and perform safe mapping. In the safe mapping, by the position detection sensor 66 provided on the wafer transfer device 60, it is determined whether or not the position of the wafer W1 as the temperature measurement target is normal, such as for example, whether or not the wafer W1 protrudes from the wafer boat 50 or whether or not the position thereof deviates. In addition, when the position of the wafer W1 is not normal, the controller 100 notifies an abnormality to stop the operation of the wafer transfer device 60. The wafer W1 as the temperature measurement target is not particularly limited as long as it is the wafer W that is carried out from the wafer boat 50 and collected into the FOUP, but may be the wafer W located at the top side of the wafer boat 50. When the wafer boat 50 is carried out from the heat treatment furnace 80, the temperature at the top side of the wafer boat 50 tends to be the highest because the wafer boat 50 is taken out from the heat treatment furnace 80 to the outside in the order of the bottom side, the central portion, and the top side of the wafer boat 50. Therefore, when measuring the temperature of the top side of the wafer boat 50, it may be presumed that the temperature of the central portion and the bottom side of the wafer boat 50 is lower than the temperature of the top side. In addition, safe mapping may be equally performed on a wafer W2 one stage below the wafer W1 as the temperature measurement target. Meanwhile, when the cooling time has not elapsed in step ST1, step ST1 is repeated until the cooling time passes.

Subsequently, the controller 100 controls the operation of the wafer transfer device 60 so that the fork 63 moves from a standby position P1 to a measurement position P2 (step ST3). The measurement position P2 is a position at which the temperature of the wafer W1 as the temperature measurement target is measured, and for example, as illustrated in FIG. 4B, may be a position between the wafer W1 as the temperature measurement target and the wafer W2 one stage below the wafer W1 among the plurality of wafers W held on the wafer boat 50. The standby position P1 is a position separated from the measurement position P2, and for example, as illustrated in FIG. 4B, may be a position on the lateral side of the wafer boat 50 at the same height as the measurement position P2.

Subsequently, the controller 100 determines whether or not the temperature of the wafer W1 as the temperature measurement target continues to be equal to or less than a threshold (predetermined temperature) for a first time (step ST4). The first time may be determined according to the characteristics of the temperature sensor 67 and may be, for example, 10 seconds. The threshold may be determined according to, for example, the heat resistance of materials constituting, for example, the wafer transfer device 60 and the FOUP, and may be, for example, 80° C.

In step ST4, when the temperature of the wafer W1 continues to be equal to or less than the threshold for the first time, the controller 100 controls the operation of the wafer transfer device 60 so as to perform entire mapping, as illustrated in FIG. 4C (step ST5). The entire mapping is mapping performed on all of the wafers W held on the wafer boat 50 by moving the fork 63 in the vertical direction. In the entire mapping, by the position detection sensor 66 provided on the fork 63, with respect to all of the wafers W held on the wafer boat 50, it is determined whether or not the position of the wafer W is normal, such as for example, whether or not the wafer W protrudes from the wafer boat 50 or whether or not the position thereof deviates. In addition, when the position of any wafer W is not normal, the controller 100 notifies an abnormality to stop the operation of the wafer transfer device 60.

Subsequently, the controller controls the operation of the wafer transfer device 60 so as to carry out the product wafer Wp and the monitor wafer Wm as the carry-out target wafers W among the plurality of wafers W held on the wafer boat 50 (step ST6). In the embodiment of the present disclosure, the plurality of forks 63 are used to carry out a plurality of wafers W from the wafer boat 50 and transport the wafers W into the FOUP. When all of the carry-out target wafers W are completely carried out, the processing is terminated. In addition, the order of carrying out the wafers W is not particularly limited.

When the temperature of the wafer W exceeds the threshold within the first time in step ST4, the controller 100 controls the operation of the wafer transfer device 60 so that the fork 63 moves from the measurement position P2 to the standby position P1 (step ST7).

Subsequently, the controller 100 determines whether or not the second time (standby time) has elapsed after the movement of the fork 63 to the standby position P1 (step ST8). The standby time may be determined according to the characteristics of the temperature sensor 67, and for example, may be 30 seconds.

When the standby time has elapsed in step ST8, the processing returns to step ST3. That is, the controller 100 controls the operation of the wafer transfer device 60 so as to again move the fork 63 from the standby position P1 to the measurement position P2. Meanwhile, when the standby time has not elapsed in step ST8, step ST8 is repeated until the standby time passes.

Figure 5:
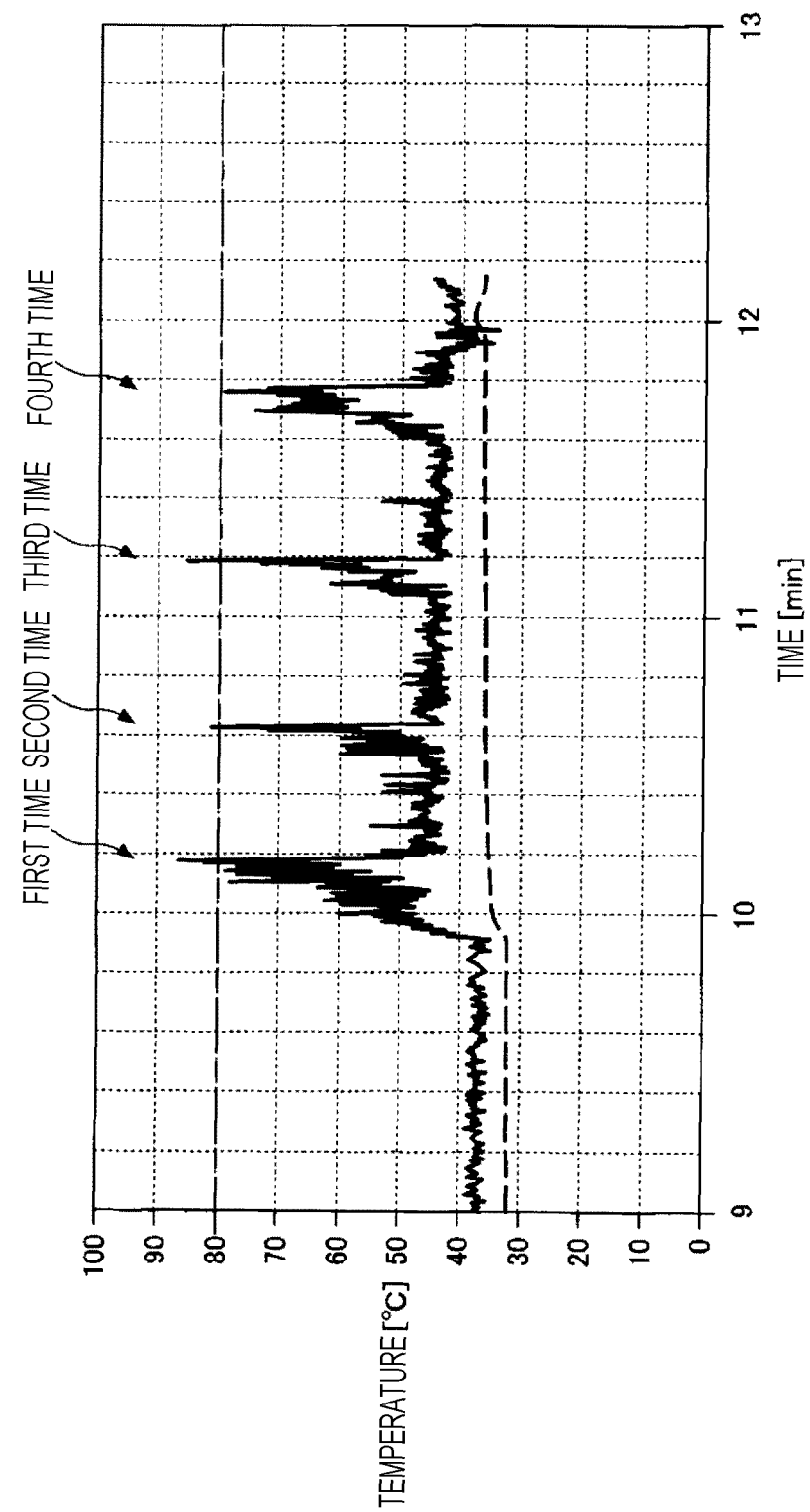
FIG. 5 is a view illustrating a temporal transition of the temperature measured by a temperature sensor.

Next, a temporal transition of the temperature measured by the temperature sensor 67 until the carry-out of the wafer W becomes possible after the wafer transfer device 60 according to the embodiment of the present disclosure starts to measure the temperature of the wafer W subjected to heat treatment will be described with reference to FIG. 5. FIG. 5 is a view illustrating a temporal transition of the temperature measured by the temperature sensor 67. In FIG. 5, the horizontal axis indicates the elapsed time (min) after the carry-out of the wafer boat 50 from the heat treatment furnace 80 starts, and the vertical axis indicates the temperature (° C.). The solid line indicates the temperature measured by the temperature sensor 67, the broken line indicates the temperature of the guide mechanism 61 of the wafer transfer device 60, and the one-dot dashed line indicates the threshold. In addition, in the example of FIG. 5, the cooling time is set to 10 minutes, the first time is set to 10 seconds, and the second time is set to 30 seconds.

As illustrated in FIG. 5, in the temperature measurements of the wafer W of the first to third times at the measurement position P2, since the temperature of the wafer W exceeds 80° C. within 10 seconds at all times, the fork 63 moves from the measurement position P2 to the standby position P1. Meanwhile, in the temperature measurement of the wafer W of the fourth time, since the temperature does not exceed 80° C. within 10 seconds, the wafer W is carried out by the fork 63.

In this manner, in the embodiment of the present disclosure, since the temperature of the wafer W may be measured in real time in a non-contact manner and since the wafer W may be rapidly transported from the wafer boat 50 to the carrier C at a point in time at which the measured temperature becomes equal to or less than the threshold, the standby time may be shortened. As a result, it is possible to shorten the time required to collect the wafer W by the shortened standby time and improve productivity.

In addition, in the embodiment of the present disclosure, as illustrated in FIG. 5, even when the fork 63 is moved to the measurement position P2, the temperature of the guide mechanism 61 of the wafer transfer device 60 hardly changes and is within a range from 30° C. to 40° C. Therefore, there is almost no influence of the temperature on the moving body 62 by the movement of the fork 63 to the measurement position P2.

In addition, in the above example, a case of determining the timing at which the wafer W is carried out from the wafer boat 50 based on the measurement result of the temperature of one wafer W among the plurality of wafers W held on the wafer boat 50 has been described by way of example, but the disclosure is not limited thereto. For example, the timing at which the wafer W is carried out from the wafer boat 50 may be determined based on the measurement results of the temperatures of two or more wafers W among the plurality of wafers W held on the wafer boat 50.

Figure 6:
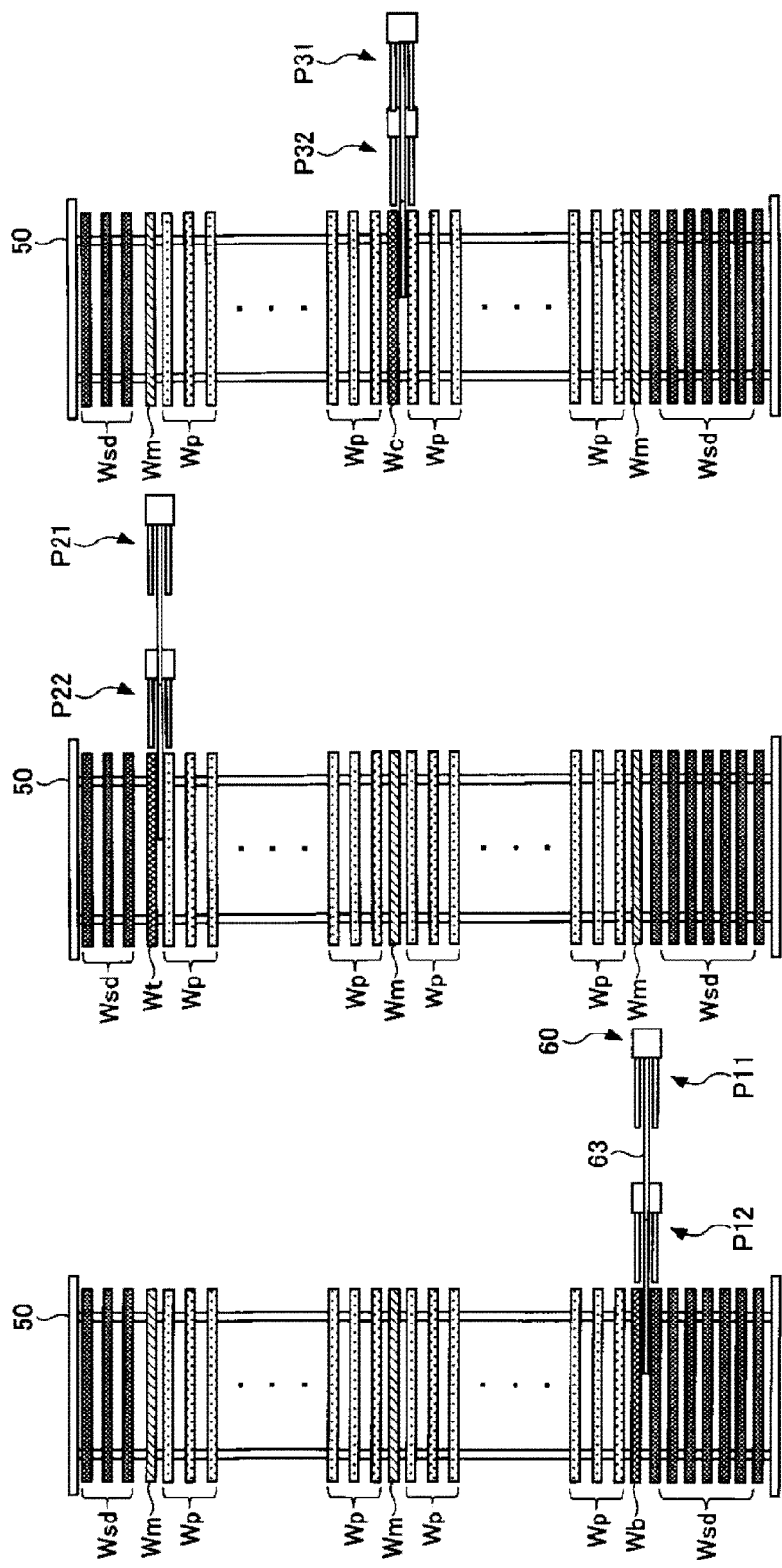
FIGS. 6A to 6C are schematic view illustrating another example of an operation of the wafer transfer device according to the embodiment of the present disclosure.

FIGS. 6A to 6C are schematic views illustrating another example of an operation of the wafer transfer device 60 according to the embodiment of the present disclosure. FIGS. 6A to 6C illustrate an exemplary case where the timing at which the wafer W is carried out from the wafer boat 50 is determined based on the measurement results of the temperatures of three wafers W among the plurality of wafers W held on the wafer boat 50.

First, as illustrated in FIG. 6A, temperature measurement is performed on a monitor wafer Wb located at the bottom side (hereinafter referred to as "BTM") among the plurality of wafers W held on the wafer boat 50 by the above-described method. Specifically, after safe mapping, the fork 63 is moved between a measurement position P12 and a standby position P11 until the temperature measured by the temperature sensor 67 at the measurement position P12 continues to be equal to or less than 80° C. for 10 seconds.

When the temperature measured by the temperature sensor 67 at the measurement position P12 continues to be equal to or less than 80° C. for 10 seconds, as illustrated in FIG. 6B, temperature measurement is performed on a monitor wafer Wt located at the top side (hereinafter referred to as "TOP") among the plurality of wafers W held on the wafer boat 50 by the above-described method. Specifically, after safe mapping, the fork 63 is moved between a measurement position P22 and a standby position P21 until the temperature measured by the temperature sensor 67 at the measurement position P22 continues to be equal to or less than 80° C. for 10 seconds.

When the temperature measured by the temperature sensor 67 at the measurement position P22 continues to be equal to or less than 80° C. for 10 seconds, as illustrated in FIG. 6C, temperature measurement is performed on a monitor wafer Wc located at the central portion (hereinafter referred to as "CTR") among the plurality of wafers W held on the wafer boat 50 by the above-described method. Specifically, after safe mapping, the fork 63 is moved between a measurement position P32 and a standby position P31 until the temperature measured by the temperature sensor 67 at the measurement position P32 continues to be equal to or less than 80° C. for 10 seconds.

When the temperature measured by the temperature sensor 67 at the measurement position P32 continuous to be equal to or less than 80° C. for 10 seconds, a product wafer Wp and a monitor wafer Wm as carry-out target wafers W among the plurality of wafers W held on the wafer boat 50 are carried out by the fork 63.

In addition, in the example of FIGS. 6A to 6C, a case where the temperature is measured in the order of the monitor wafer Wb located at the BTM, the monitor wafer Wt located at the TOP, and the monitor wafer Wc located at the CTR has been described, but the temperature may be measured in another order.

Figure 7:
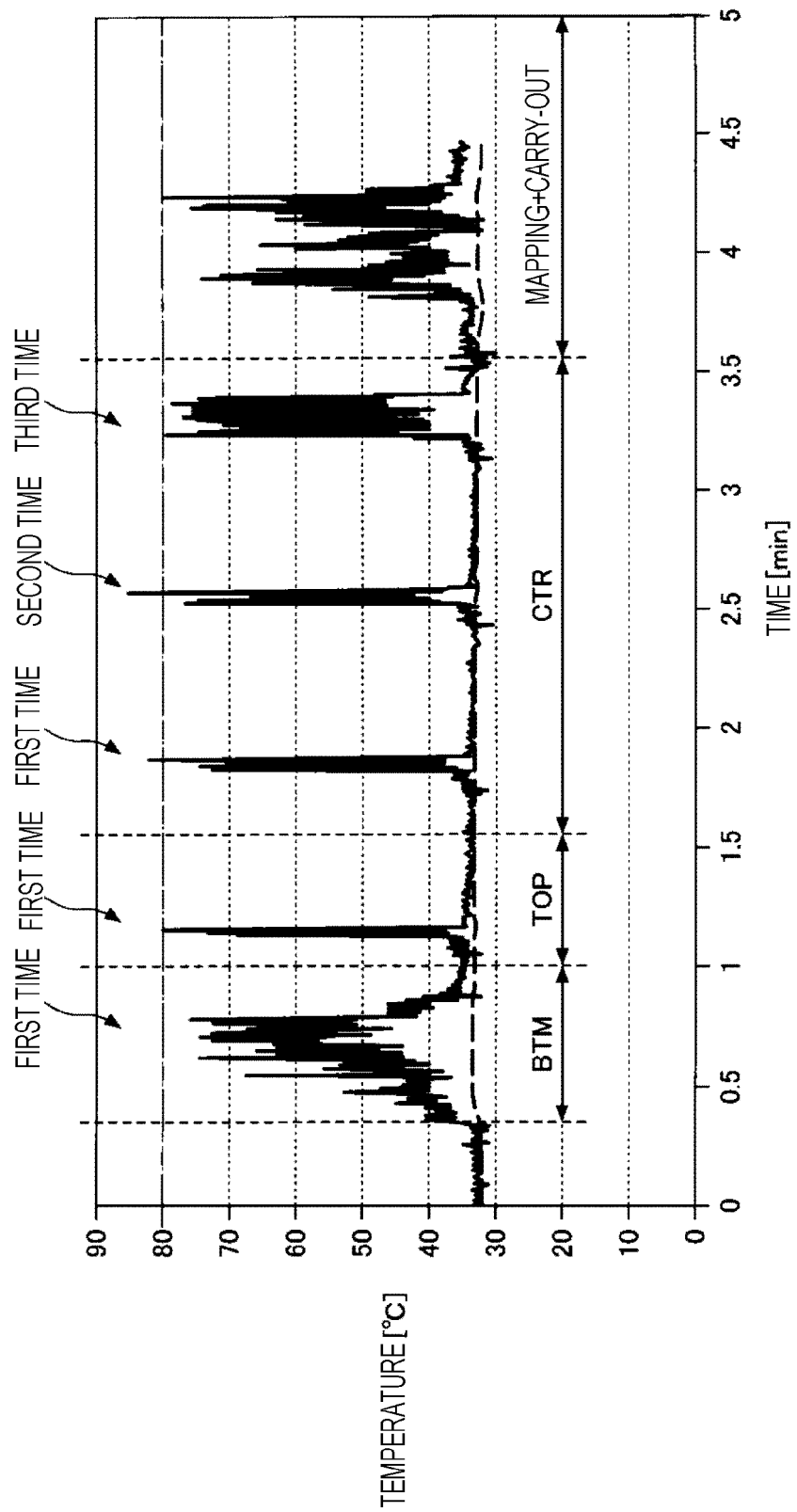
FIG. 7 is a view illustrating a temporal transition of the temperature measured by the temperature sensor.

Next, a temporal transition of the temperature measured by the temperature sensor 67 until the carry-out of the wafer W becomes possible after the wafer transfer device 60 according to the embodiment of the present disclosure starts to measure the temperature of the wafer W subjected to heat treatment will be described with reference to FIG. 7. FIG. 7 is a view illustrating a temporal transition of the temperature measured by the temperature sensor 67. In FIG. 7, the horizontal axis indicates the elapsed time (min) after the carry-out of the wafer boat 50 from the heat treatment furnace 80 starts, and the vertical axis indicates the temperature (° C.). The solid line indicates the temperature measured by the temperature sensor 67, the broken line indicates the temperature of the guide mechanism 61 of the wafer transfer device 60, and the one-dot dashed line indicates the threshold. In addition, in the example of FIG. 7, the cooling time is set to 10 minutes, the first time is set to 10 seconds, and the second time is set to 30 seconds.

As illustrated in FIG. 7, with respect to the monitor wafer Wb located at the BTM, in the temperature measurement of the first time at the measurement position, the temperature of the monitor wafer Wb does not exceed 80° C. within 10 seconds. Thus, after the temperature measurement of the first time, the temperature of the monitor wafer Wt located at the TOP is measured. With respect to the monitor wafer Wt located at the TOP, the temperature of the monitor wafer Wt does not exceed 80° C. within 10 seconds in the temperature measurement of the first time. Thus, after the temperature measurement of the first time, the temperature of the monitor wafer Wc located at the CTR is measured. With respect to the monitor wafer Wc located at the CTR, in the temperature measurements of the first and second times, since the temperature of the wafer W exceeds 80° C. within 10 seconds at all times, the wafer W is not carried out by the fork 63. Meanwhile, in the temperature measurement of the third time, the temperature of the monitor wafer Wc does not exceed 80° C. within the first time (10 seconds). Thus, after the temperature measurement of the third time, mapping is performed on all of the wafers W held on the wafer boat 50, and then the wafer W is carried out.

In this manner, in the embodiment of the present disclosure, since the temperature of the wafer W may be measured in real time and since the wafer W may be rapidly transported from the wafer boat 50 to the carrier C when the measured temperature becomes equal to or less than the threshold, the standby time may be shortened. As a result, it is possible to shorten the time required to collect the wafer W by the shortened standby time and improve productivity.

In addition, the controller 100 may determine whether or not a capability of cooling the wafer W is normal based on the time after the wafer boat 50 is carried out from the heat treatment furnace 80 and before the plurality of wafers W start to be carried out. Specifically, when the time after the wafer boat 50 is carried out from the heat treatment furnace 80 and before the plurality of wafers W start to be carried out is longer than a predetermined time as compared with the past time after the wafer boat 50 is carried out from the heat treatment furnace 80 and before the plurality of wafers W start to be carried out, the controller 100 may determine that there is an abnormality in the capability of cooling the wafer W.

Figure 8A:
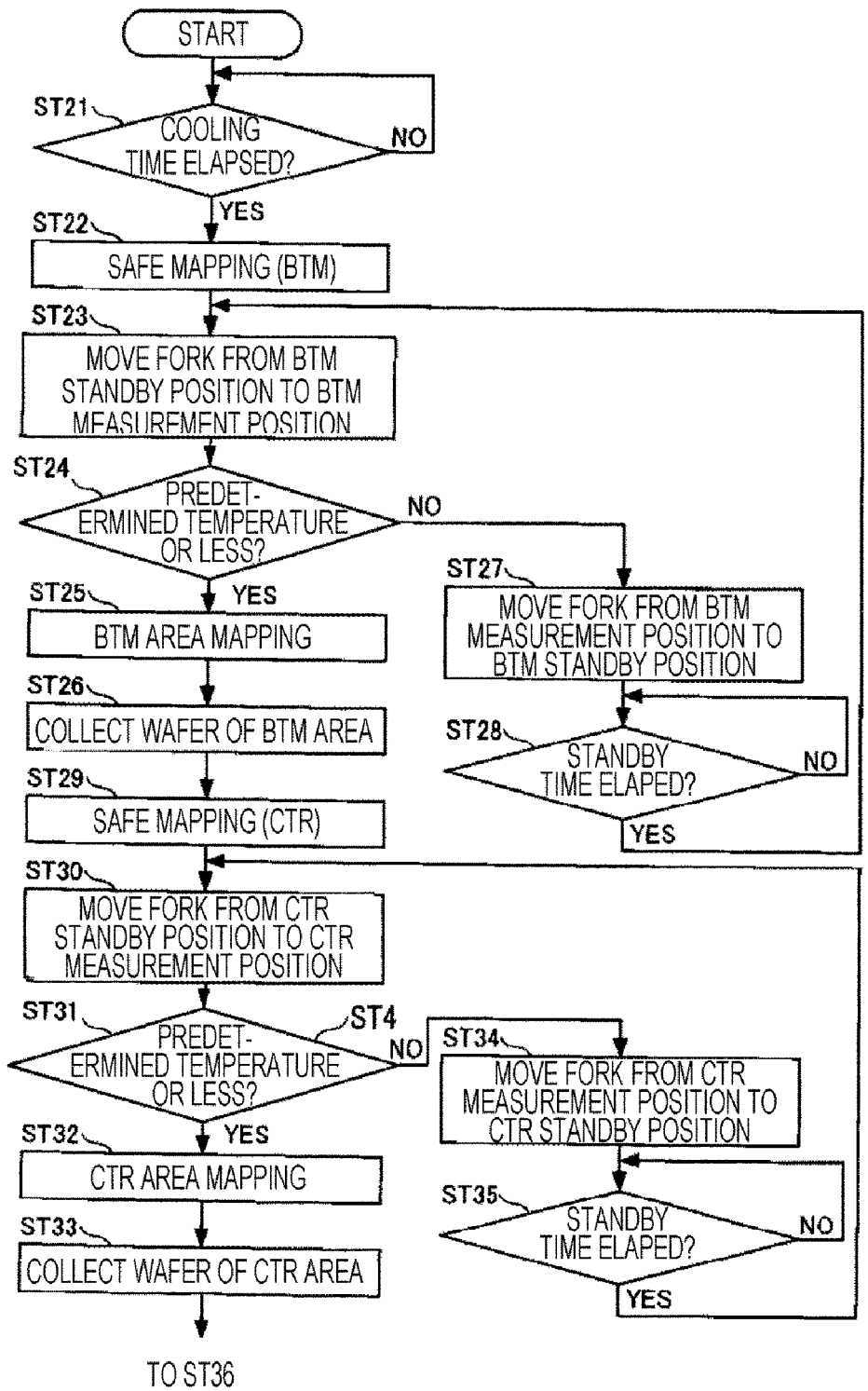
FIGS. 8A and 8B are schematic views illustrating still another example of an operation of the wafer transfer device according to the embodiment of the present disclosure.
Figure 8B:
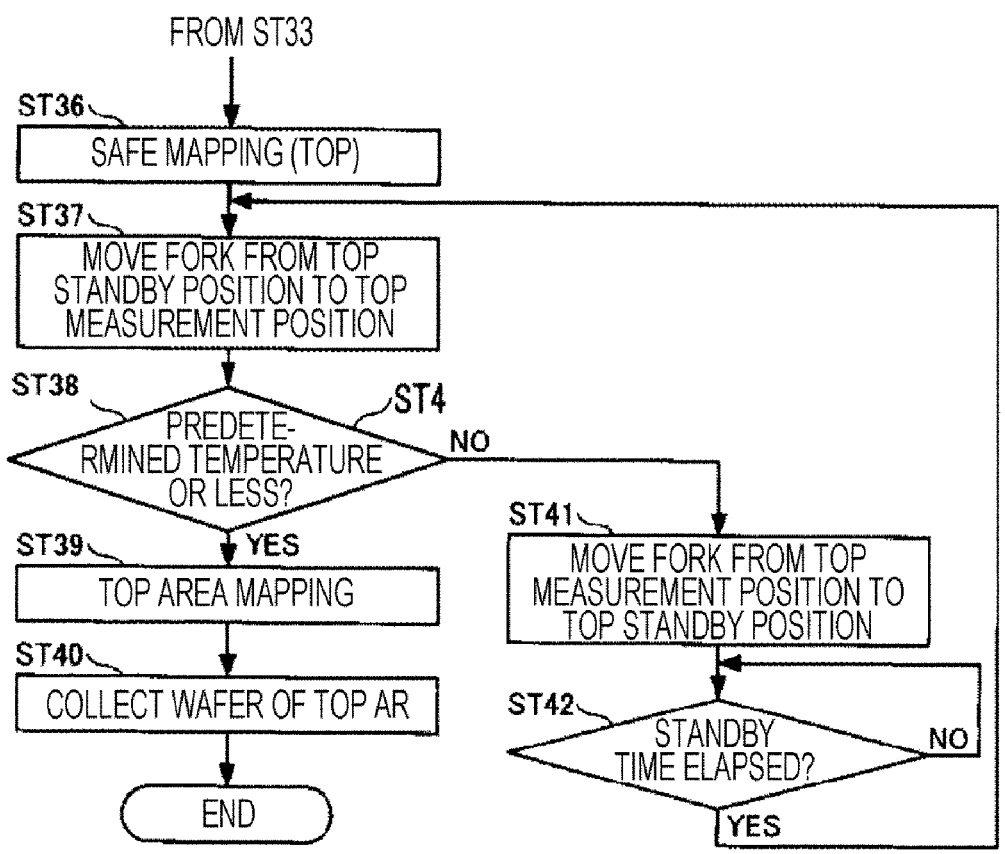

Next, still another example of an operation of the wafer transfer device 60 according to the embodiment of the present disclosure will be described. FIGS. 8A and 8B are schematic views illustrating still another example of an operation of the wafer transfer device 60 according to the embodiment of the present disclosure. FIGS. 9A to 9C are schematic views illustrating the example of the operation of the wafer transfer device according to the embodiment of the present disclosure. In the example of FIGS. 8A, 8B, 9A, 9B, and 9C, the temperature measurement and the carry-out of the wafer W described above are performed for each of a plurality of areas (e.g., BTM, CTR, and TOP). This will be described in detail below.

When the cooling time has elapsed in step ST21, the controller 100 controls an operation of the wafer transfer device 60 so as to perform safe mapping on the wafer Wb as the temperature measurement target located at the BTM (step ST22). Specifically, as illustrated in FIG. 9A, the controller 100 controls the operation of the wafer transfer device 60 so as to move the fork 63 to a position at the same height as the wafer Wb as the temperature measurement target and perform safe mapping. In the safe mapping, by the position detection sensor 66 provided on the wafer transfer device 60, it is determined whether or not the position of the wafer Wb as the temperature measurement target is normal, such as for example, whether or not the wafer Wb as the temperature measurement target protrudes from the wafer boat 50 or whether or not the position thereof deviates. In addition, when the position of the wafer Wb as the temperature measurement target is not normal, the controller 100 notifies an abnormality to stop the operation of the wafer transfer device 60. Meanwhile, when the cooling time has not elapsed in step ST21, step ST21 is repeated until the cooling time passes.

Subsequently, the controller 100 controls the operation of the wafer transfer device 60 so that the fork 63 moves from the standby position P11 to the measurement position P12 (step ST23). The measurement position P12 is a position at which the temperature of the wafer Wb as the temperature measurement target is measured. The standby position P11 is a position separated from the measurement position P12, and for example, may be a position on the lateral side of the wafer boat 50 at the same height as the measurement position P12.

Subsequently, the controller 100 determines whether or not the temperature of the wafer Wb as the temperature measurement target continues to be equal to or less than a threshold (predetermined temperature) for a predetermined time (step ST24). The predetermined time may be determined according to the characteristics of the temperature sensor 67, and may be, for example, 10 seconds. The threshold may be determined according to, for example, the heat resistance of materials constituting, for example, the wafer transfer device 60 and the FOUP, and may be, for example, 80° C.

When the temperature of the wafer Wb as the temperature measurement target continues to be equal to or less than the threshold for the predetermined time in step ST24, the controller 100 controls the operation of the wafer transfer device 60 so as to perform BTM area mapping (step ST25). The BTM area mapping is mapping performed on all of the wafers W located at the BTM by moving the fork 63 in the vertical direction. In the BTM area mapping, by the position detection sensor 66 provided on the fork 63, with respect to all of the wafers W located at the BTM, it is determined whether or not the position of the wafer W is normal, such as for example, whether or not the wafer W protrudes from the wafer boat 50 or whether or not the position thereof deviates. In addition, when the position of any wafer W is not normal, the controller 100 notifies an abnormality to stop the operation of the wafer transfer device 60.

Subsequently, the controller controls the operation of the wafer transfer device 60 so as to carry out the product wafer Wp as the carry-out target wafer W and the wafer Wb as the temperature measurement target located at the BTM among the plurality of wafers W held on the wafer boat 50 (step ST26). In an embodiment, a plurality of forks 63 are used to carry out a plurality of wafers W from the wafer boat 50 and transfer the wafers W into the FOUP. When all of the carry-out target wafers W located at the BTM are completely carried out, the processing proceeds to step ST29.

In step ST24, when the temperature of the wafer W exceeds the threshold within the predetermined time, the controller 100 controls the operation of the wafer transfer device 60 so that the fork 63 moves from the measurement position P12 to the standby position P11 (step ST27).

Subsequently, the controller 100 determines whether or not a predetermined time (standby time) has elapsed after the movement of the fork 63 to the standby position P11 (step ST28). The standby time may be determined according to the characteristics of the temperature sensor 67, and may be, for example, 30 seconds.

When the standby time has elapsed in step ST28, the processing returns to step ST23. That is, the controller 100 controls the operation of the wafer transfer device 60 so that the fork 63 moves again from the standby position P11 to the measurement position P12. Meanwhile, when the standby time has not elapsed in step ST28, step ST28 is repeated until the standby time passes.

When all of the carry-out target wafers W located at the BTM are completely carried out in step ST26, the controller 100 controls the operation of the wafer transfer device 60 so as to perform safe mapping on the wafer Wc as the temperature measurement target located at the CTR (step ST29). Specifically, as illustrated in FIG. 9B, the controller 100 controls the operation of the wafer transfer device 60 so as to move the fork 63 to a position at the same height as the wafer Wc as the temperature measurement target and perform safe mapping. In the safe mapping, by the position detection sensor 66 provided on the wafer transfer device 60, it is determined whether or not the position of the wafer Wc as the temperature measurement target is normal, such as for example, whether the wafer Wc as the temperature measurement target protrudes from the wafer boat 50 or whether the position thereof deviates. In addition, when the position of the wafer Wc as the temperature measurement target is not normal, the controller 100 notifies an abnormality to stop the operation of the wafer transfer device 60.

Subsequently, the controller 100 controls the operation of the wafer transfer device 60 so that the fork 63 moves from the standby position P31 to the measurement position P32 (step ST30). The measurement position P32 is a position at which the temperature of the wafer Wc as the temperature measurement target is measured. The standby position P31 is a position separated from the measurement position P32, and may be, for example, a position on the lateral side of the wafer boat 50 at the same height as the measurement position P32.

Subsequently, the controller 100 determines whether or not the temperature of the wafer Wc as the temperature measurement target continues to be equal to or less than a threshold (predetermined temperature) for a predetermined time (step ST31). The predetermined time may be determined according to the characteristics of the temperature sensor 67, and may be set to, for example, 10 seconds. The threshold may be determined according to, for example, the heat resistance of materials constituting the wafer transfer device 60 and the FOUP, for example, and may be, for example, 80° C.

In step ST31, when the temperature of the wafer Wc as the temperature measurement target continues to be equal to or less than the threshold for the predetermined time, the controller 100 controls the operation of the wafer transfer device 60 so as to perform CTR area mapping (step ST32). The CTR area mapping is mapping performed on all of the wafers W located at the CTR by moving the fork 63 in the vertical direction. In the CTR area mapping, by the position detection sensor 66 provided on the fork 63, with respect to all of the wafers W located at the CTR, it is determined whether or not the position of the wafer W is normal, such as for example, whether or not the wafer W protrudes from the wafer boat 50 or whether or not the position thereof deviates. In addition, when the position of any wafer W is not normal, the controller 100 notifies an abnormality to stop the operation of the wafer transfer device 60.

Subsequently, the controller 100 controls the operation of the wafer transfer device 60 so as to carry out the product wafer Wp and the monitor wafer Wm as the carry-out target wafers W located at the CTR among the plurality of wafers W held on the wafer boat 50 (step ST33). In an embodiment, a plurality of forks 63 are used to carry out a plurality of wafers W from the wafer boat 50 and transport the wafers W into the FOUP. When all of the carry-out target wafers W located at the CTR are completely carried out, the processing proceeds to step ST36.

In step ST31, when the temperature of the wafer W exceeds the threshold within the predetermined time, the controller 100 controls the operation of the wafer transfer device 60 so that the fork 63 moves from the measurement position P32 to the standby position P31 (step ST34).

Subsequently, the controller 100 determines whether or not a predetermined time (standby time) has elapsed after the movement of the fork 63 to the standby position P31 (step ST35). The standby time may be determined according to the characteristics of the temperature sensor 67, and may be, for example, 30 seconds.

When the standby time has elapsed in step ST35, the processing returns to step ST30. That is, the controller 100 controls the operation of the wafer transfer device 60 so that the fork 63 moves again from the standby position P31 to the measurement position P32. Meanwhile, when the standby time has not elapsed in step ST35, step ST35 is repeated until the standby time passes.

When all the carry-out target wafers W located at the CTR are completely carried out in step ST33, the controller 100 controls the operation of the wafer transfer device 60 so as to perform safe mapping on the wafer Wt as the temperature measurement target located at the TOP (step ST36). Specifically, as illustrated in FIG. 9C, the controller 100 controls the operation of the wafer transfer device 60 so as to move the fork 63 to a position at the same height as the wafer Wt as the temperature measurement target and perform safe mapping. In the safe mapping, by the position detection sensor 66 provided on the wafer transfer device 60, it is determined whether or not the position of the wafer Wt as the temperature measurement target is normal, such as for example, whether or not the wafer Wt as the temperature measurement target protrudes from the wafer boat 50 or whether or not the position thereof deviates. In addition, when the position of the wafer Wt as the temperature measurement target is not normal, the controller 100 notifies an abnormality to stop the operation of the wafer transfer device 60.

Subsequently, the controller 100 controls the operation of the wafer transfer device 60 so that the fork 63 moves from the standby position P21 to the measurement position P22 (step ST37). The measurement position P22 is a position at which the temperature of the wafer Wt as the temperature measurement target is measured. The standby position P21 is a position separated from the measurement position P22, and may be, for example, a position on the lateral side of the wafer boat 50 at the same height as the measurement position P22.

Subsequently, the controller 100 determines whether or not the temperature of the wafer Wt as the temperature measurement target continues to be equal to or less than a threshold (predetermined temperature) for a predetermined time (step ST38). The predetermined time may be determined according to the characteristics of the temperature sensor 67, and may be, for example, 10 seconds. The threshold may be determined according to, for example, the heat resistance of materials constituting the wafer transfer device 60 and the FOUP, for example, and may be, for example, 80° C.

In step ST38, when the temperature of the wafer Wt as the temperature measurement target continues to be equal to or less than the threshold for the predetermined time, the controller 100 controls the operation of the wafer transfer device 60 so as to perform TOP area mapping (step ST39). The TOP area mapping is mapping performed on all of the wafers W located at the TOP by moving the fork 63 in the vertical direction. In the TOP area mapping, by the position detection sensor 66 provided on the fork 63, with respect to all of the wafers W located at the TOP, it is determined whether or not the position of the wafer W is normal, such as for example, whether or not the wafer W protrudes from the wafer boat 50 or whether or not the position thereof deviates. In addition, when the position of any wafer W is not normal, the controller 100 notifies an abnormality to stop the operation of the wafer transfer device 60.

Subsequently, the controller 100 controls the operation of the wafer transfer device 60 so as to carry out the product wafer Wp and the monitor wafer Wm as the carry-out target wafers W located at the TOP among the plurality of wafers W held on the wafer boat 50 (step ST40). In an embodiment, a plurality of forks 63 are used to carry out a plurality of wafers W from the wafer boat 50 and transport the wafers W into the FOUP. When all the carry-out target wafers W located at the TOP are completely carried out, the processing is terminated.

When the temperature of the wafer W exceeds the threshold within the predetermined time in step ST38, the controller 100 controls the operation of the wafer transfer device 60 so that the fork 63 moves from the measurement position P22 to the standby position P21 (step ST41).

Subsequently, the controller 100 determines whether or not a predetermined time (standby time) has elapsed after the movement of the fork 63 to the standby position P21 (step ST42). The standby time may be determined according to the characteristics of the temperature sensor 67, and may be set to, for example, 30 seconds.

When the standby time has elapsed in step ST42, the processing returns to step ST37. That is, the controller 100 controls the operation of the wafer transfer device 60 so that the fork 63 moves again from the standby position P21 to the measurement position P22. Meanwhile, when the standby time has not elapsed in step ST42, step ST42 is repeated until the standby time passes.

In this manner, in the example of FIGS. 8A, 8B, 9A, 9B, and 9C, since the temperature of the wafer W is measured in real time and since the wafer W may be rapidly transported from the wafer boat 50 to the carrier C when the measured temperature becomes equal to or less than the threshold, the standby time may be shortened. As a result, it is possible to shorten the time required to collect the wafers W by the shortened standby time and improve productivity.

In addition, in the example of FIGS. 8A, 8B, 9A, 9B, and 9C, the temperature measurement and the carry out of the wafer W are performed for each of a plurality of areas (e.g., BTM, CTR, and TOP). Thereby, it is possible to further shorten the time required to collect the wafer W since the wafer W may be carried out in order from the area that has become equal to or less than the predetermined temperature among the plurality of areas.

When the wafer boat 50 is carried out from the heat treatment furnace 80, since the wafer boat 50 is taken out from the heat treatment furnace 80 to the outside in the order of the bottom side, the central portion, and the top side of the wafer boat 50, the temperature at the top side of the wafer boat 50 tends to be higher than the temperature at the central portion and the temperature at the central portion tends to be higher than the temperature at the bottom side. Therefore, even when the temperatures of the top side and the central portion of the wafer boat 50 are higher than a predetermined temperature, the temperature of the bottom side of the wafer boat 50 may be equal to or less than the predetermined temperature in some cases. In this case, in the example of FIGS. 8A, 8B, 9A, 9B, and 9C, the wafer W located at the bottom side of the wafer boat 50 may be transported to the carrier C before the temperatures of the top side and the central portion of the wafer boat 50 become be equal to or less than the predetermined temperature. In other words, the wafer W located at the bottom side of the wafer boat 50 may be transported to the carrier C while waiting for the temperature fall of the wafers W located at the top side and the central portion of the wafer boat 50. In addition, before the temperature of the top side of the wafer boat 50 becomes equal to or less than the predetermined temperature, the wafer W located at the central portion of the wafer boat 50 may be transported to the carrier C. In other words, the wafer W located at the central portion of the wafer boat 50 may be transported to the carrier C while waiting for the temperature fall of the wafer W located at the top side of the wafer boat 50. As a result, it is possible to shorten the time required to collect wafer W to about one third as compared with a case where the temperature measurement and the carry out of the wafer W are not performed for each of a plurality of areas (e.g., BTM, CTR, and TOP).

In addition, in the example of FIGS. 8A, 8B, 9A, 9B, and 9C, a case where the plurality of areas are BTM, CTR, and TOP has been described, but the plurality of areas may be, for example, two areas, or four or more areas.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A transfer device comprising:
a transporter including a temperature sensor disposed thereon and configured to move between a measurement position at which a temperature of a transfer target object is measured and a standby position separated from the measurement position; and
a controller configured to control an operation of the transporter,
wherein the controller moves the transporter between the measurement position and the standby position, and transfers the transfer target object by the transporter when the temperature measured by the temperature sensor at the measurement position continues to be equal to or less than a threshold for a first time determined based on characteristics of the temperature sensor.

2. The transfer device of claim 1, wherein the controller moves the transporter to the standby position when the temperature exceeds the threshold within the first time at the measurement position, and moves the transporter to the measurement position after an elapse of a second time at the standby position.

3. The transfer device of claim 2, wherein the first time and the second time are determined based on characteristics of the temperature sensor.

4. The transfer device of claim 1, wherein the transporter further includes a position detection sensor disposed thereon to detect a position of the transfer target object, and
the controller determines whether or not the position of the transfer target object detected by the position detection sensor is normal, and moves the transporter to the measurement position when the position of the transfer target object is normal.

5. The transfer device of claim 1, wherein the transfer target object is a substrate held on a substrate holder configured to hold a plurality of substrates substantially horizontally at a predetermined interval in a vertical direction.

6. A substrate processing apparatus comprising:
a heat treatment furnace;
a substrate holder configured to accommodate a plurality of substrates in the heat treatment furnace in a state where the substrates are held;
a transporter including a temperature sensor disposed thereon and configured to move between a measurement position at which a temperature of the plurality of substrates is measured and a standby position separated from the measurement position; and
a controller configured to control an operation of the transporter,
wherein the controller moves the transporter between the measurement position and the standby position, and carries out the plurality of substrates from the substrate holder by the transporter when the temperature measured by the temperature sensor at the measurement position continues to be equal to or less than a threshold for a first time determined based on characteristics of the temperature sensor.

7. The substrate processing apparatus of claim 6, wherein the controller determines whether or not a capability of cooling the plurality of substrates is normal based on a time after the substrate holder is carried out from the heat treatment furnace and before the plurality of substrates starts to be carried out.

8. A transfer method comprising:
moving a transporter including a temperature sensor disposed thereon between a measurement position at which a temperature of a transfer target object is measured and a standby position separated from the measurement position; and
transferring the transfer target object when the temperature measured by the temperature sensor at the measurement position continues to be equal to or less than a threshold for a first time determined based on characteristics of the temperature sensor.

9. The transfer device of claim 1, wherein the temperature sensor is disposed between the transfer target object and the other transfer target object adjacent to the transfer target object when the transporter is disposed at the measurement position.

10. The transfer device of claim 1, wherein the temperature sensor measures the temperature of the transfer target object in a non-contact manner.

11. The transfer device of claim 5, wherein the standby position is on a lateral side of the substrate holder at a same height as the measurement position.

12. The transfer device of claim 5, wherein the transfer target object is disposed at a top portion of the substrate holder.

13. The transfer device of claim 5, wherein the transfer target object is disposed at at least two portions of a bottom portion, a central portion and a top portion of the substrate holder.

14. The transfer device of claim 12, wherein the substrate holder is taken out from a heat treatment furnace to an outside in an order of a bottom portion, a central portion, and the top portion of the substrate holder.

* * * * *